(12) United States Patent
Liu et al.

(10) Patent No.: US 12,087,619 B2
(45) Date of Patent: Sep. 10, 2024

(54) SEMICONDUCTOR DEVICE AND METHOD OF FABRICATING THE SAME

(71) Applicant: Winbond Electronics Corp., Taichung (TW)

(72) Inventors: Chi-Ching Liu, Taichung (TW); Yu-Ting Chen, Taichung (TW); Chang-Tsung Pai, Taichung (TW); Shun-Li Lan, Taichung (TW); Yen-De Lee, Taichung (TW); Chih-Jung Ni, Taichung (TW)

(73) Assignee: Winbond Electronics Corp., Taichung (TW)

( * ) Notice: Subject to any disclaimer, the term of this patent is extended or adjusted under 35 U.S.C. 154(b) by 75 days.

(21) Appl. No.: 18/087,802

(22) Filed: Dec. 22, 2022

(65) Prior Publication Data

US 2023/0129196 A1 Apr. 27, 2023

Related U.S. Application Data

(62) Division of application No. 16/817,572, filed on Mar. 12, 2020, now abandoned.

(51) Int. Cl.
*H01L 21/768* (2006.01)
*H10B 99/00* (2023.01)

(52) U.S. Cl.
CPC ....... *H01L 21/76816* (2013.01); *H10B 99/00* (2023.02)

(58) Field of Classification Search
CPC ......... H01L 21/76816; H01L 21/76849; H01L 21/76883; H01L 21/76805; H10B 99/00; H10B 63/30; H10N 70/023; H10N 70/063; H10N 70/20; H10N 70/826; H10N 70/841; H10N 70/8833
See application file for complete search history.

(56) References Cited

U.S. PATENT DOCUMENTS

2021/0126051 A1* 4/2021 Dutta ................. H01L 21/2633

* cited by examiner

*Primary Examiner* — Thanhha S Pham
(74) *Attorney, Agent, or Firm* — JCIPRNET

(57) ABSTRACT

A method for manufacturing a semiconductor device, including the following steps. A plurality of first vias are formed in a first dielectric layer in a memory cell region and a peripheral region. A surface treatment is performed on the plurality of first vias to form a plurality of sacrificial layers. The plurality of sacrificial layers are removed to form a plurality of recesses. A plurality of protective layers are formed in the plurality of recesses. A memory device is formed on the first dielectric layer in the memory cell region. A second dielectric layer is formed on the memory device and on the first dielectric layer. A plurality of second vias is formed in the second dielectric layer in the memory cell region and the peripheral region to electrically connect the memory device in the memory cell region and the first vias in the peripheral region, respectively.

19 Claims, 7 Drawing Sheets

SEMICONDUCTOR DEVICE AND METHOD OF FABRICATING THE SAME

CROSS-REFERENCE TO RELATED APPLICATION

This application is a divisional application of and claims the priority benefit of U.S. application Ser. No. 16/817,572, filed on Mar. 12, 2020, now pending. The entirety of the above-mentioned patent application is hereby incorporated by reference herein and made a part of this specification.

BACKGROUND

Technical Field

The invention relates to an integrated circuit and a manufacturing method thereof, and in particular to a semiconductor device and a manufacturing method thereof.

Description of Related Art

With the advancement of science and technology, electronic products are developing towards the trend of high speed, high efficiency, thinness and shortness. Effective utilization of chip area and improvement of yield are very important issues at present.

In recent years, the development of resistive memory such as resistive random access memory (RRAM) has been extremely rapid, and resistive memory is currently the most noticeable future memory. Resistive memory has the potential advantages of low power consumption, high speed operation, high density, and compatibility with complementary metal-oxide-semiconductor (CMOS) process technology. Therefore, resistive memory is very suitable as the next generation of non-volatile memory devices.

However, during the etching process of forming a memory device, vias located in the peripheral region may be over-etched, so that gaps in the vias are exposed, causing the slurry used in the subsequent CMP process remaining in the gaps. As a result, the contact resistance is too high, or even the vias formed later cannot contact the previously formed vias.

SUMMARY

To make the aforementioned more comprehensible, several embodiments accompanied with drawings are described in detail as follows.

An embodiment of the present invention provides a semiconductor device and a manufacturing method thereof, which may avoid problems such as high contact resistance between the vias or abnormal contact.

An embodiment of the present invention provides a method for manufacturing a semiconductor device, which includes the following steps. A plurality of first vias are formed in a first dielectric layer in a memory cell region and a peripheral region. A surface treatment is performed on the plurality of first vias to form a plurality of sacrificial layers. The plurality of sacrificial layers are removed to form a plurality of recesses. A plurality of protective layers are formed in the plurality of recesses. A memory device is formed on the first dielectric layer in the memory cell region. A second dielectric layer is formed on the memory device and on the first dielectric layer. A plurality of second vias are formed in the second dielectric layer in the memory cell region and the peripheral region to electrically connect the memory device in the memory cell region and the first vias in the peripheral region, respectively.

The invention of the present invention proposes a semiconductor device including a plurality of first vias, respectively in a first dielectric layer in a memory cell region and a peripheral region; a plurality of protective layers embedded in the plurality of first vias; a memory device, located on the multiple of protective layers and the first dielectric layer in the memory cell region; a second dielectric layer on the memory device and the first dielectric layer; and plurality of second vias, located in the second dielectric layer in the memory cell region and the peripheral region. The second vias located in the memory cell region are electrically connected to the memory device, and the second vias located in the peripheral region are electrically connected to the first vias through the plurality of protective layers.

Based on the above, the semiconductor device and manufacturing method of the implant of the present invention may increase the process window by forming the protective layers, avoid problems such as excessive contact resistance between the vias or abnormal contact, and reduce spacing between the memory devices.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
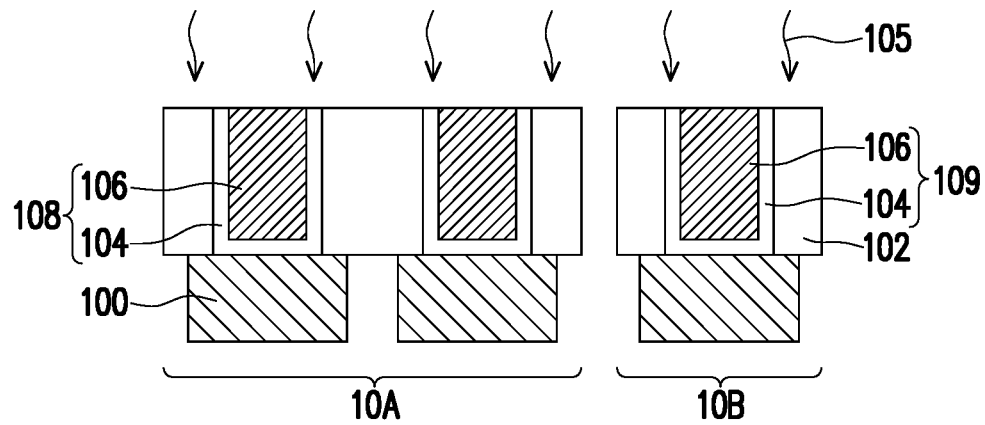
FIGS. 1A to 1I are schematic cross-sectional views illustrating a manufacturing process of a semiconductor device according to a first embodiment of the present invention.

Referring to FIG. 1A, vias 108 and 109 are formed in a dielectric layer 102 in a memory cell region 10A and a peripheral region 10B to connect to conductive layers 100, respectively. The dielectric layer 102 may be a single layer or multiple layers, which may include silicon oxide, silicon nitride, or a combination thereof, and may be planarized by a planarization process. The conductive layer 100 is, for example, any one of the metal layers in a metal interconnect structure formed on a substrate, such as the first metal layer closest to the substrate. The substrate may be a semiconductor substrate or a semiconductor-on-insulator (SOI) substrate. The metal layer is, for example, tungsten, aluminum, copper, or a combination thereof formed by a physical vapor deposition method. Other deice may be included between the substrate and the metal layer, such as a transistor.

The vias 108 and 109 may include a barrier layer 104 and a plug 106, respectively. The method of forming the barrier layer 104 and the plug 106 may be, for example, first forming via openings (not shown) in the dielectric layer 102. After that, a barrier material layer is conformally formed on the dielectric layer 102 and in the via openings, and then a conductive layer is filled into the via openings. Thereafter, a chemical mechanical polishing process or an etch-back process is performed to remove the barrier material layer and the conductive layer on the dielectric layer 102. The material of the barrier layer 104 may be tungsten nitride, titanium nitride, tantalum nitride, or a combination thereof, and formed by a chemical vapor deposition method, for example. The material of the plug 106 includes a metal material such as tungsten, and may be formed by a chemical vapor deposition method, for example. Although only two vias are shown in the memory cell region 10A, and only one the vias is shown in the peripheral region 10B as shown in FIG. 1A, the present invention is not limited thereto. In other embodiments, the number of the vias may be adjusted as needed.

Figure 1B:
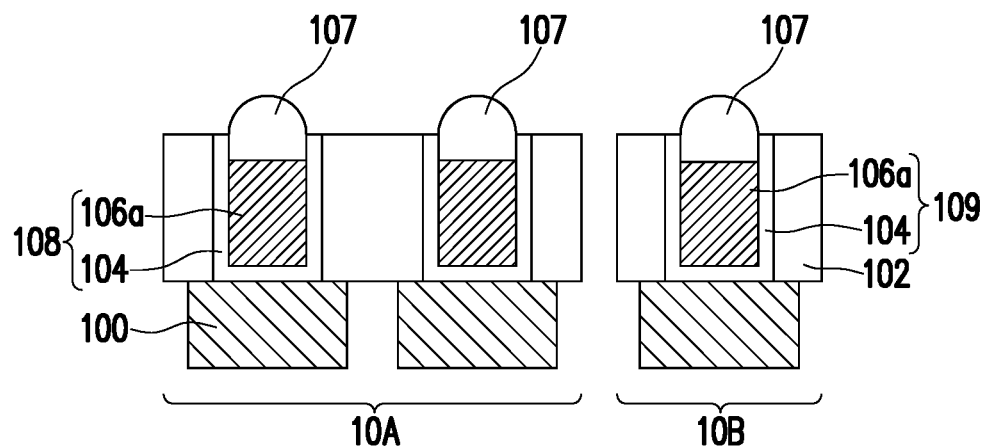

Referring to FIGS. 1A and 1B, a surface treatment process 105 is performed, so that the surface of the plug 106 react to form sacrificial layers 107. The surface treatment process 105 is, for example, an oxidation process. In an embodiment, the oxidation process may be a wet oxidation process. The wet oxidation process may use an aqueous solution of sulfuric acid and hydrogen peroxide or an aqueous solution of phosphoric acid as an oxidant. When the surface treatment process 105 is an oxidation process, the sacrificial layers 107 are metal oxides, such as tungsten oxide.

Figure 1C:
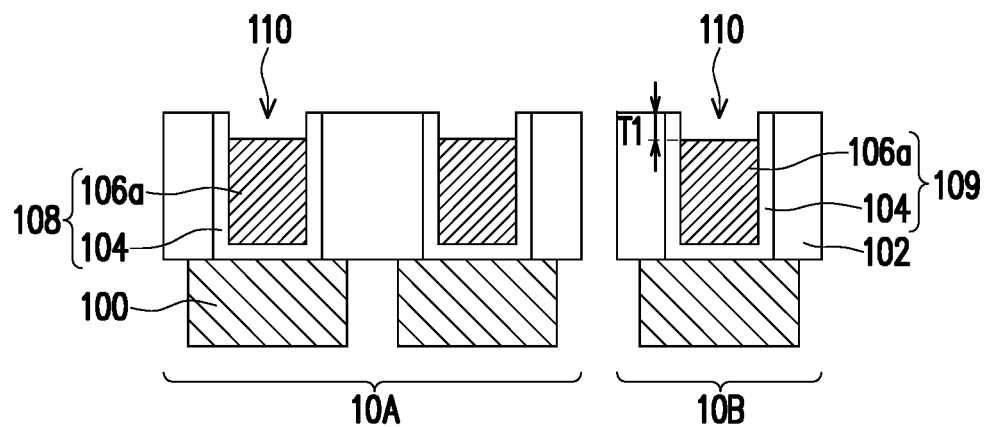

Referring to FIGS. 1B and 1C, an etching process is performed to remove the sacrificial layers 107, and thereby exposing the plug 106a. The plug 106a and the barrier layer 104 form a recess 110. The depth T1 of the recess 110 is, for example, 40 nm to 100 nm. The etching process is, for example, a wet etching process. When the sacrificial layers 107 are metal oxides, ammonia may be used as an etchant.

Figure 1D:
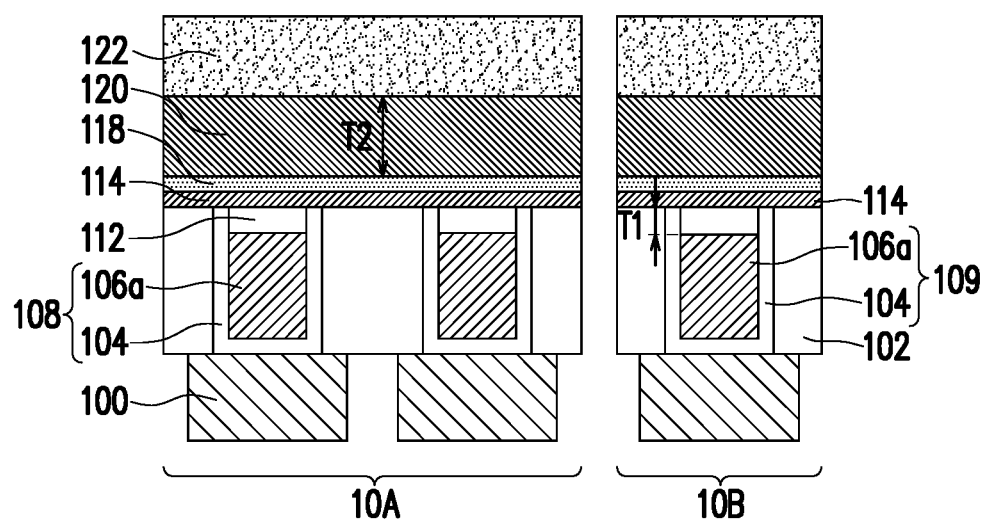

Referring to FIGS. 1C and 1D, a protective layer 112 is formed in each recess 110. The material of the protective layer 112 is different from that of the plug 106a. The material of the protective layer 112 includes a conductive material. The conductive material is, for example, tantalum (Ta), titanium (Ti), hafnium (HO, zirconium (Zr), platinum (Pt), aluminum (Al), or a combination thereof. The protective layer 112 is formed by, for example, forming a protective material layer on the dielectric layer 102 and the recesses 110, and then planarizing by a chemical mechanical polishing (CMP) process or etch-back to remove the dielectric layer 102 on the protective material layer. The top surface of the protective layer 112 may be coplanar with the top surface of the dielectric layer 102. During the planarization process, the protective layer 112 may protect the plug 106a underneath. Therefore, the etching solution or slurry used in the planarization process may be prevented from flowing into a gap in the plug 106a.

Next, a first electrode 114, a variable resistance layer 118, a second electrode 120, and a capping layer 122 are sequentially formed on the dielectric layer 102 and the protective layer 112. The materials of the first electrode 114 and the second electrode 120 may include a metal and a metal nitride respectively. The materials of the first electrode 114 and the second electrode 120 include titanium nitride (TiN), platinum (Pt), iridium (Ir), ruthenium (Ru), titanium (Ti), tungsten (W), tantalum (Ta), aluminum (Al), zirconium (Zr), hafnium (HO, nickel (Ni), copper (Cu), cobalt (Co), iron (Fe), gadolinium (Gd), molybdenum (Mo), or a combination thereof, and may be formed by, for example, a physical vapor deposition or a chemical vapor deposition. The first electrode 114 and the second electrode 120 may be a single layer or multiple layers. In some embodiments, the second electrode 120 may further include one or more barrier layers.

The material of the barrier layer includes metal oxides, such as titanium oxynitride, aluminum oxide, hafnium oxide, zirconium oxide, or a combination thereof. The barrier layer prevents the unevenness of conductive filaments caused by a large current flowing through the second electrode when setting or resetting.

The material of the variable resistance layer 118 may include a metal oxide, such as hafnium oxide (e.g., HfO or $HfO_2$, etc.), lanthanum oxide, gadolinium oxide, yttrium oxide, zirconium oxide, titanium oxide, tantalum oxide, nickel oxide, tungsten oxide, copper oxide, cobalt oxide, iron oxide, aluminum oxide, or a combination thereof, and the formation method thereof is, for example, a chemical vapor deposition method. The thickness T2 of the variable resistance layer 118 is greater than the thickness T1 of the protective layer 112. When the thickness T1 is, for example, 40 nm to 100 nm, the thickness T2 is, for example, 50 nm to 120 nm. The capping layer 122 may protect the second electrode 120 from plasma damage during subsequent etching processes. In addition, the capping layer 122 may also be used as an anti-reflection layer in the subsequent lithography process. The material of the capping layer 122 is, for example, silicon oxynitride, silicon nitride, or a combination thereof formed by a chemical vapor deposition. The capping layer 122 may be a single layer or multiple layers.

Figure 1E:
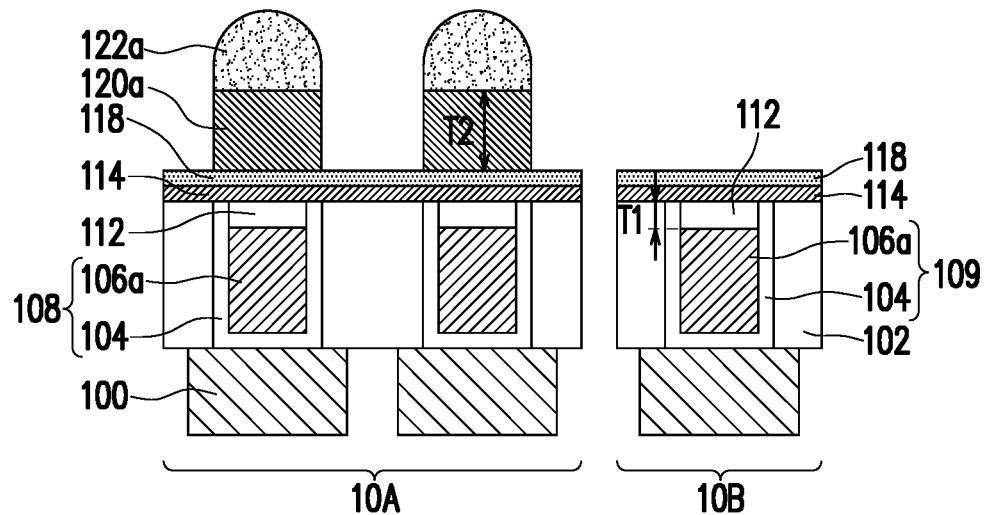

Referring to FIG. 1E, the capping layer 122 and the second electrode 120 are patterned by a lithography and etching process to form the capping layer 122a and the second electrode 120a in the memory cell region 10A. The etching process includes an anisotropic etching process, such as a reactive ion etching process. The etching gas used in the reactive ion etching process is, for example, methane, $BCl_3$, $CF_4$, $CHF_3$ or a combination thereof. The capping layer 122a and the second electrode 120a have substantially vertical sidewalls, and the capping layer 122a has a dome shape.

Figure 1F:
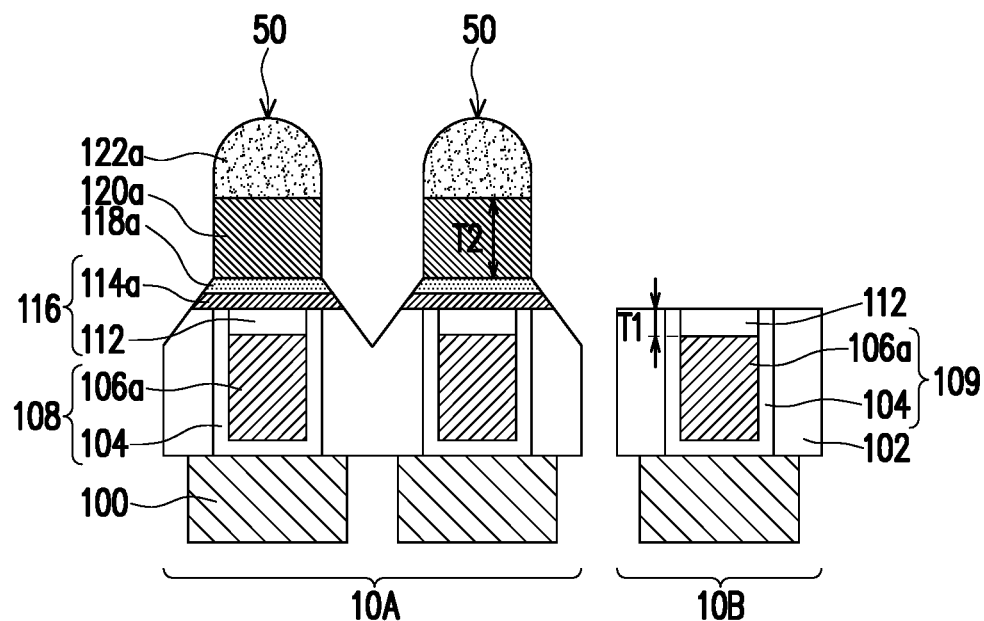

Referring to FIG. 1F, the etching process is continued, and the variable resistance layer 118 and the first electrode 114 are patterned to form the variable resistance layer 118a and the first electrode 114a in the memory cell region 10A. Since the variable resistance layer 118a and the first electrode 114a have different etching characteristics, both of them have inclined sidewalls. In addition, during the etching process, an over-etching process is performed to ensure that the first electrodes 114a of the adjacent memory cells in the memory cell region 10A can be completely separated, so part of the dielectric layer 102 may also be etched. Because the material and the etching rate of the protective layer 112 are different from those of the variable resistance layer 118 and the first electrode 114, the protective layer 112 in a peripheral region 10B can protect the underlying plug 106a and avoid the plug 106a suffering from etching damage. Therefore, the process window may be increased by the formation of the protective layer 112.

In some embodiments, the first electrode 114a, the variable resistance layer 118a, the second electrode 120a, and the capping layer 122a in the memory cell region 10A constitute a memory cell 50. In other embodiments, the protective layer 112 in the memory cell region 10A may also be considered as part of the memory cell 50. The second electrode 120a is used as the upper electrode 120a of the memory device 50, and the protective layer 112 and the first electrode 114a in the memory cell region 10A may be collectively used as the lower electrode 116 of the memory device 50.

Figure 1G:
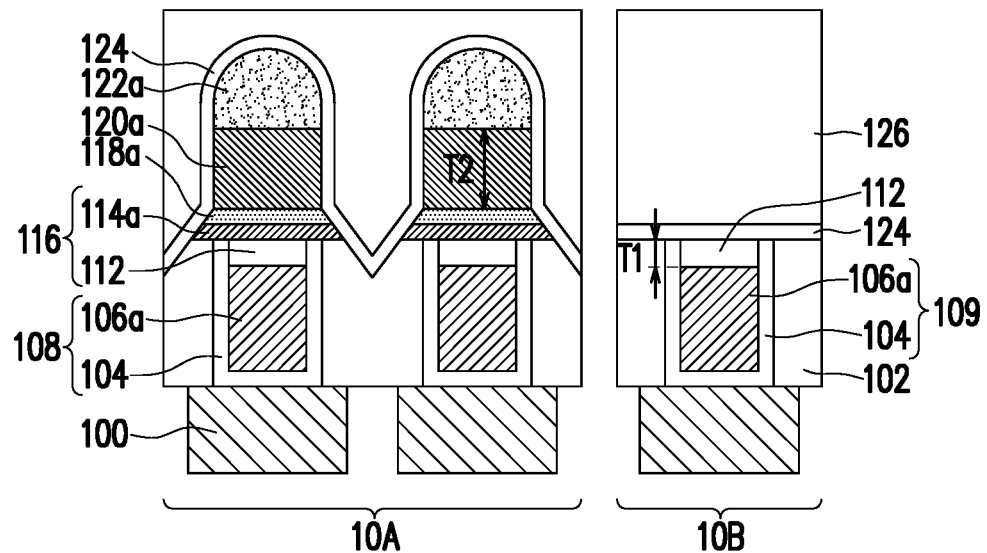

Referring to FIG. 1G, a barrier layer 124 and a dielectric layer 126 are formed in the memory cell region 10A and the peripheral region 10B. The material of the barrier layer 124 includes metal oxides such as hafnium oxide, lanthanum oxide, gadolinium oxide, yttrium oxide, zirconium oxide, titanium oxide, tantalum oxide, nickel oxide, tungsten oxide, copper oxide, cobalt oxide, iron oxide, aluminum oxide or a combination thereof, and may be formed by, for example, an atomic layer deposition or a chemical vapor deposition. The material of the dielectric layer 126 may include silicon oxide, silicon nitride, or a combination thereof, and may be formed by, for example, a chemical vapor deposition. The dielectric layer 126 may be a single layer or multiple layers. The material of the dielectric layer 126 may include silicon oxide, silicon nitride, or a combination thereof, and may be formed by, for example, a chemical vapor deposition. The dielectric layer 126 may be a planarization layer planarized by a CMP process.

Figure 1H:
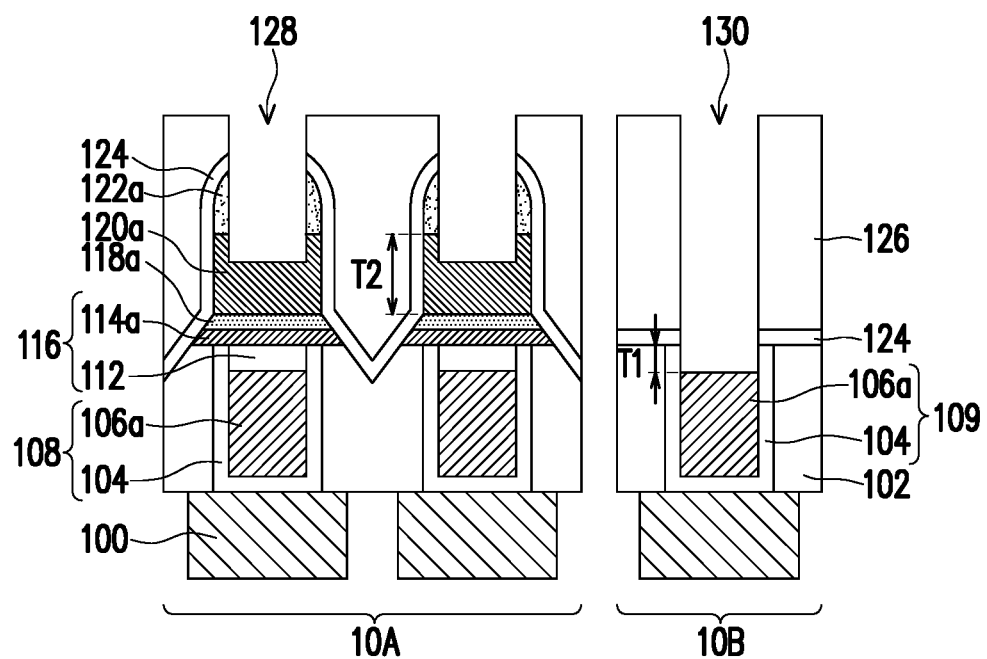

Referring to FIG. 1H, portions of the dielectric layer 126, the barrier layer 124, and the capping layer 122a in the memory cell region 10A are removed by a lithography and etching process to form via openings 128 that expose the second electrode 120a. In addition, the dielectric layer 126, the barrier layer 124, and the protective layer 112 in the peripheral region 10B are also removed to form via openings 130 that expose the plug 106a.

During the etching process, since the material of the capping layer 122 is different from that of the dielectric layer 126, and the etching rate of the capping layer 122a is smaller than that of the dielectric layer 126, the capping layer 122 may be served as an etch stop layer. After the protective layer 112 in the peripheral region 10B is exposed, the capping layer 122 in the memory cell region 10A is removed. After that, the protective layer 112 in the peripheral region 10B is removed. During the process of removing the protective layer 112 in the peripheral region 10B, a part of the second electrode 120a is etched. Since the thickness T2 of the second electrode 120a is greater than the thickness T1 of the protective layer 112 of the peripheral region 10B, after the protective layer 112 in the peripheral region 10B is completely removed, the second electrode 120a with a sufficient thickness remains in the memory cell region 10A.

Figure 1I:
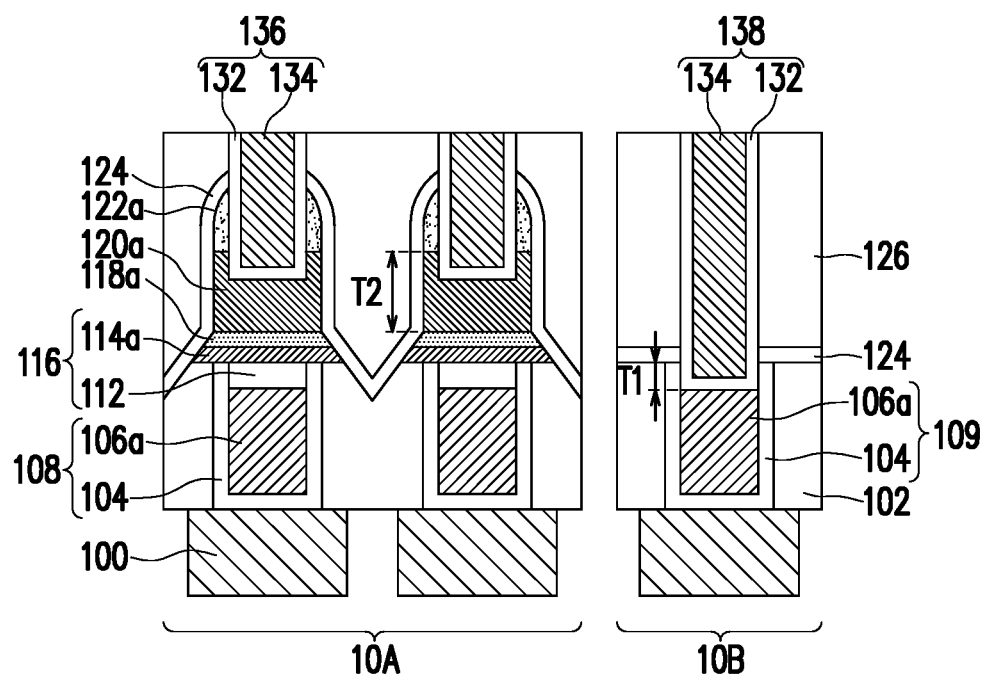

Referring to FIG. 1I, vias 136 and 138 are formed in the via openings 128 and 130, respectively. The vias 136 and 138 may include a barrier layer 132 and a plug 134, respectively. The formation method of the barrier layer 132 and plug 134 may include, for example, forming a barrier material layer conformally on the dielectric layer 126 and the via openings 128 and 130, and then forming a conductive layer. Thereafter, a chemical mechanical polishing process or an etch-back process is performed to remove the barrier material layer and the conductive layer on the dielectric layer 126. The material of the barrier material layer may be, for example, tungsten nitride, titanium nitride, tantalum nitride, or a combination thereof, and may be formed by, for example, a chemical vapor deposition. The conductive layer includes a metal material such as tungsten, and may be formed by, for example, a chemical vapor deposition.

After that, a dielectric layer and metal features (not shown) electrically connected to the vias 136 and 138 are formed on the dielectric layer 126, respectively. The metal feature is a part of a metal interconnect structure, which may be a metal layer, such as a second metal layer.

In this embedment, the vias 136 are electrically connected and in physical contact with the second electrode 120a. The vias 138 passes through the dielectric layer 126 and extends into the dielectric layer 102, and is electrically connected and in physical contact with the vias 109. The variable resistance layer 118 and the first electrode 114a have inclined sidewalls. The bottom area of the variable resistance layer 118 is substantially the same as the top area of the first electrode 114a.

The first electrode 114a covers and is in physical contact with the protective layer 112, the barrier layer 104, and a portion of the dielectric layer 102. The protective layer 112 is embedded in the vias 108 and is in physical contact with and surrounded by the plug 106 and the barrier layer 104 of the vias 108.

Figure 2A:
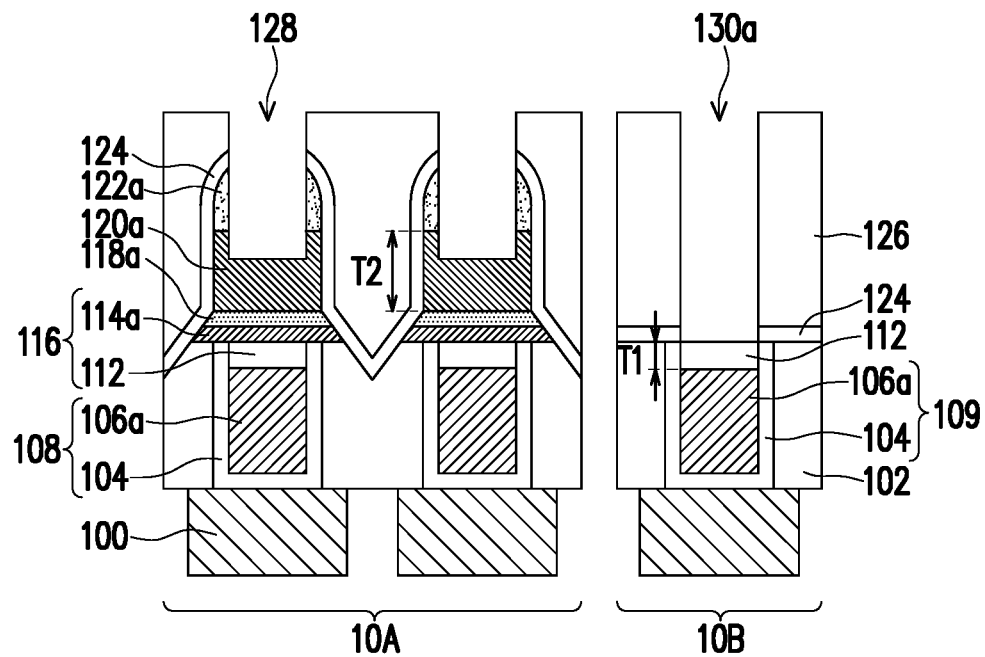
FIGS. 2A to 2B are schematic cross-sectional views illustrating a manufacturing process of a semiconductor device according to a second embodiment of the present invention.

Referring to FIG. 2A, the present embodiment is similar to the first embodiment. After the dielectric layer 126 (FIG. 1G) is formed in accordance with the method of the first embodiment, via openings 128 and 130a are formed in the memory cell region 10A and the peripheral region 10B, respectively. The via openings 128 pass through the dielectric layer 126, the barrier layer 124, and the capping layer 122a to expose the second electrode 120a. The via openings 130a expose the protective layer 112. In other words, during the formation of the via openings 128 and 130a, the protective layer 112 in the peripheral region 10B is remined without being removed by etching.

Figure 2B:
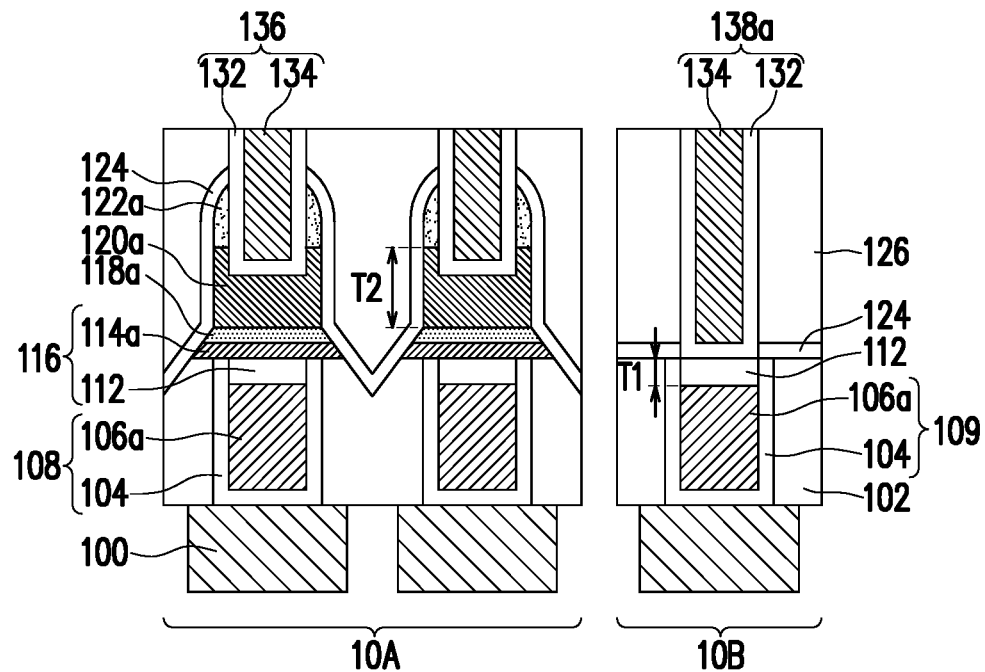

Referring to FIG. 2B, vias 136 and 138a are formed in the via openings 128 and 130a in accordance with the method of above embodiment, respectively. The vias 136 and 138a may include a barrier layer 132 and a plug 134, respectively. The via 136 is electrically connected and in physical contact with the second electrode 120a. The via 138a and the via 109 are not in physical contact, but are electrically connected through the protective layer 112. The protective layer 112 is embedded in the vias 109. The protective layer 112 is in physical contact with the plug 106 and the barrier layer 104 of the vias 109 and is surrounded by the plug 106 and the barrier layer 104 of the via 109.

Figure 3:
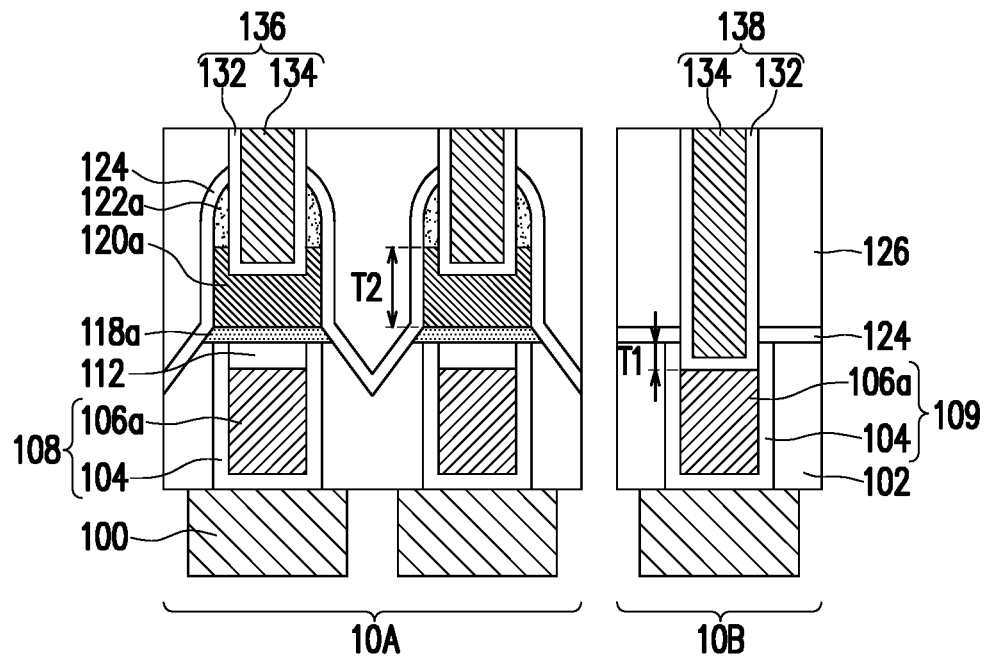
FIG. 3 is a schematic cross-sectional view of a semiconductor device according to a third embodiment of the present invention.

Referring to FIG. 3, the present embodiment is similar to the first embodiment. After the protective layer 112 is formed in the recess 110 in accordance with the method of the first embodiment, the first electrode 114 is no longer formed, and the variable resistance layer 118, a second electrode 120 and a capping layer 122 are directly formed (FIGS. 1C and 1D). Thereafter, the method of the first embodiment is followed until the vias 136 and 138a are formed.

The structure of the semiconductor device of the present embodiment is similar to the structure of the semiconductor device of the first embodiment. The difference is that in the present embodiment, the protective layer 112 in the memory cell region 10A is used as the first electrode (or referred to as a lower electrode) of a memory device. Therefore, the first electrode (the protective layer 112) of the memory device is in physical contact with and surrounded by the plug 106 and the barrier layer 104 of the vias 108. The variable resistance layer 118a has inclined sidewalls tapered toward the second electrode 120a due to the etching characteristics thereof. In other words, the size of the top surface of the variable resistance layer 118a is smaller than the size of the bottom surface thereof.

On the other hand, since the via openings used to form the vias 108 may have vertical sidewalls or inclined sidewalls tapered toward the conductive layer 100. Therefore, the first electrode (the protective layer 112) may have vertical sidewalls or inclined sidewalls tapered toward the conductive layer 100. Therefore, the size of the top surface of the first electrode (the protective layer 112) may be greater than or equal to the size of the bottom surface of the first electrode (the protective layer 112).

The sidewalls of the first electrode (that is the protective layer 112) and the variable resistance layer 118a are discontinuous. The top area of the first electrode (the protective layer 112) is smaller than the bottom area of the variable resistance layer 118. The first electrode (the protective layer 112), the barrier layer 104, and a portion of the dielectric layer 102 are covered by and in physical contact with the variable resistance layer 118.

Since the first electrode (the protective layer 112) is formed in the vias 108 by a damascene process, and is self-aligned with the vias 108, the process for forming the first electrode may be referred to as a self-aligned process. In addition, because the first electrode (the protective layer 112) is formed by the damascene process, there is no problem that the first electrode is difficult to etch during the fabricating process. In addition, there is no need to increase the spacing between two adjacent first electrodes in order to ensure that the two adjacent first electrodes may not be disconnected because of their inclined sidewalls. Since the size of the first electrode (the protective layer 112) is small, the distance between the memory devices may be reduced.

Figure 4:
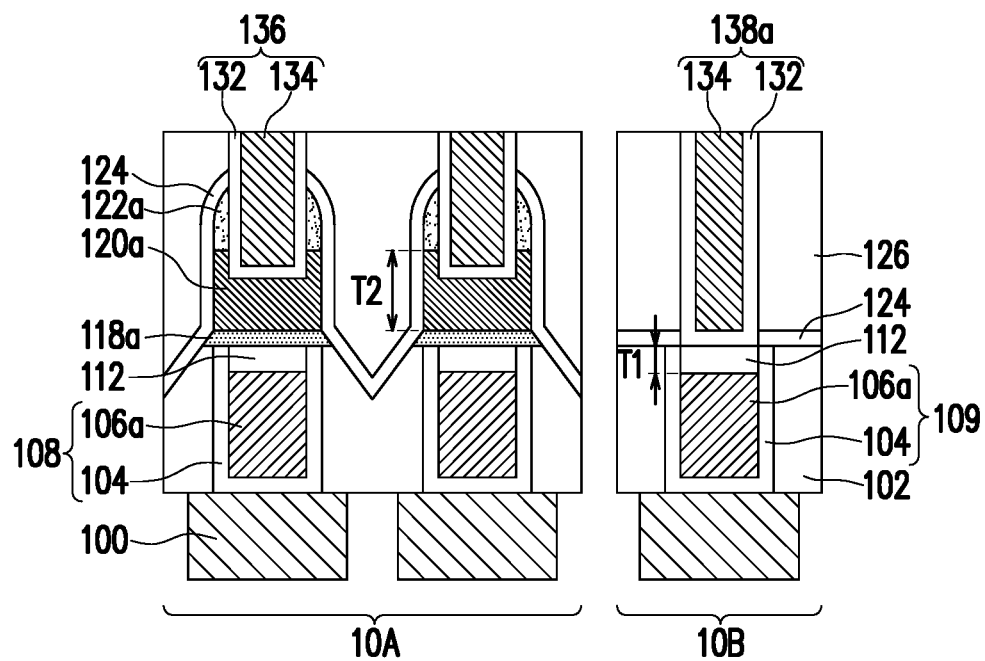
FIG. 4 is a schematic cross-sectional view of a semiconductor device according to a fourth embodiment of the present invention.

Referring to FIG. 4, the present embodiment is similar to the third embodiment. The difference is that in the present embodiment, during the process of forming via openings in the peripheral region 10B, the protective layer 112 is remained without being removed by etching. Therefore, the structure of the semiconductor device of the present embodiment is similar to the structure of the semiconductor device of the third embodiment. The difference is that vias 138*a* in the present embodiment pass through the dielectric layer 126 and the barrier layer 124, and are electrically connected and in physical contact with the protective layer 112. In other words, the vias 138*a* and the vias 109 are not in physical contact, but are electrically connected through the protective layer 112.

Through the surface treatment process and the etching process, the embodiment of the present invention may form a recess on the lower vis, and the protective layer may be formed in the recess. The formation of the protective layer may prevent the lower vias from being damaged by etching, and increase the process window.

Moreover, in some embodiments, the protective layer may be completely removed, so that there is a good contact between the upper vias and the lower vias in the peripheral region to avoid problems such as high contact resistance or abnormal contact.

In addition, in other embodiments, the protective layer may be remained and directly serves as the first electrode of the memory device. Since the protective layer may be self-aligned with the vias, no additional photomask is needed. Therefore, the process steps and costs may be reduced. On the other hand, since the size of the protective layer as the first electrode is small, the space between the memory devices may be reduced.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method of fabricating a semiconductor device, comprising:
    forming a plurality of first vias in a first dielectric layer in a memory cell region and a peripheral region;
    performing a surface treatment on the plurality of first vias, so as to form a plurality of sacrificial layers;
    removing the plurality of sacrificial layers so as to form a plurality of recesses;
    forming a plurality of protective layers in the plurality of recesses;
    forming a memory device on the first dielectric layer in the memory cell region;
    forming a second dielectric layer on the memory device and the first dielectric layer; and
    forming a plurality of second vias in the second dielectric layer in the memory cell region and the peripheral region, so as to electrically connect to the memory device in the memory cell region and the plurality of first vias in the peripheral region, respectively.

2. The method according to claim 1, wherein the forming the memory device comprises:
    forming a first electrode, a variable resistance layer, a second electrode and a capping layer on the first dielectric layer and the plurality of protective layers; and
    patterning the capping layer, the second electrode, the variable resistance layer, and the first electrode to form the memory device in contact with one of the plurality of protective layers in the memory cell region.

3. The method according to claim 2, wherein a size of a top surface of the patterned variable resistance layer is smaller than a size of a bottom surface of the patterned variable resistance layer.

4. The method according to claim 2, wherein a bottom surface of each of the plurality of second vias is lower than a top surface of the patterned second electrode of the memory device.

5. The method according to claim 2, wherein the patterned first electrode covers and is in physical contact with the one of the plurality of protective layers in the memory cell region.

6. The method according to claim 1, wherein the forming the memory device comprises:
    serving the plurality of protective layers as first electrodes;
    forming a variable resistance layer, a second electrode and a capping layer on the plurality of protective layers; and
    patterning the second electrode, the variable resistance layer, and the first electrodes to form the memory device in contact with the plurality of first vias in the memory cell region.

7. The method according to claim 6, wherein the patterned variable resistance layer covers and is in physical contact with the one of the plurality of protective layers in the memory cell region,
    sidewalls of the protective layer and the patterned variable resistance layer are discontinuous.

8. The method according to claim 1, further comprising removing the plurality of protective layers in the peripheral region before the forming the plurality of second vias, wherein the plurality of second vias in the peripheral region are in physical contact with the plurality of first vias in the peripheral region.

9. The method according to claim 1, wherein the plurality of second vias and the plurality of first vias in the peripheral region are electrically connected through the plurality of protective layers in the peripheral region.

10. The method according to claim 1, further comprising forming a recessed portion in the first dielectric layer in the memory cell region between every two adjacent first vias, wherein a bottom of the recessed portion is lower than an upper surface of each of the plurality of first vias.

11. The method according to claim 1, further comprising forming a barrier layer on the memory device and the first dielectric layer before forming the second dielectric layer,
   wherein a bottom of the barrier layer is lower than a bottom surface of the protective layer.

12. The method according to claim 2, wherein a thickness of each of the plurality of protective layers are less than a thickness of the second electrode.

13. The method according to claim 2, wherein the plurality of protective layers and the plurality of first vias have different materials.

14. The method according to claim 13, wherein a material of the plurality of protective layers comprises tantalum (Ta), titanium (Ti), hafnium (Hf), zirconium (Zr), platinum (Pt), aluminum (Al), or a combination thereof.

15. The method according to claim 1, wherein the surface treatment comprises an oxidation process.

16. The method according to claim 1, wherein the surface treatment comprises a wet oxidation process.

17. The method according to claim 16, wherein a material of the plurality of sacrificial layers comprises metal oxides.

18. The method according to claim 17, wherein the removing the plurality of sacrificial layers comprises an etching process.

19. The method according to claim 17, wherein the removing the plurality of sacrificial layers comprises a wet etching process.

* * * * *